(12) United States Patent
Sugeta et al.

(10) Patent No.: US 6,811,817 B2
(45) Date of Patent: Nov. 2, 2004

(54) METHOD FOR REDUCING PATTERN DIMENSION IN PHOTORESIST LAYER

(75) Inventors: Yoshiki Sugeta, Yokohama (JP); Fumitake Kaneko, Kanagawa-ken (JP); Toshikazu Tachikawa, Yokohama (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 0 days.

(21) Appl. No.: 10/315,065

(22) Filed: Dec. 10, 2002

(65) Prior Publication Data

US 2003/0087032 A1 May 8, 2003

Related U.S. Application Data

(62) Division of application No. 10/173,880, filed on Jun. 19, 2002.

(30) Foreign Application Priority Data

Jul. 5, 2001 (JP) .................................. 2001-205240
Jul. 5, 2001 (JP) .................................. 2001-205241
Jul. 5, 2001 (JP) .................................. 2001-205242
Sep. 28, 2001 (JP) .................................. 2001-302552
Sep. 28, 2001 (JP) .................................. 2001-302553
Sep. 28, 2001 (JP) .................................. 2001-302554
Sep. 28, 2001 (JP) .................................. 2001-302555

(51) Int. Cl.$^7$ .............................. B05D 1/36; C08K 3/00
(52) U.S. Cl. ................... 427/256; 427/372.2; 427/384; 427/385.5; 524/555; 524/556
(58) Field of Search .............................. 427/407.1, 384, 427/385.5, 272.2, 256; 524/555, 556

(56) References Cited

U.S. PATENT DOCUMENTS

| | | | | |
|---|---|---|---|---|
| 4,590,149 A | * | 5/1986 | Nakane et al. | 430/325 |
| 5,173,393 A | | 12/1992 | Sezi et al. | 430/323 |
| 5,744,540 A | | 4/1998 | Baumstark et al. | 524/558 |
| 6,107,397 A | | 8/2000 | Blankenburg et al. | 524/813 |
| 6,410,205 B1 | | 6/2002 | Leichsenring et al. | 430/273.1 |
| 6,486,058 B1 | | 11/2002 | Chun | |
| 6,555,607 B1 | | 4/2003 | Kanda et al. | 524/366 |
| 2001/0003030 A1 | | 6/2001 | Jung et al. | 430/273.1 |

FOREIGN PATENT DOCUMENTS

| | | | | |
|---|---|---|---|---|
| DE | 199 45 140 | | 4/2001 | |
| EP | 0 901 044 | | 3/1999 | |
| EP | 1 117 008 | | 7/2001 | |
| EP | 1 223 470 | | 7/2002 | |
| JP | 51094302 A | * | 8/1976 | ............. B41C/1/10 |
| JP | 63-108334 | | 5/1988 | |
| JP | 01-307228 | | 12/1989 | |
| JP | 04-364021 | | 12/1992 | |
| JP | 05-166717 | | 7/1993 | |
| JP | 05-241348 | | 9/1993 | |
| JP | 06-148896 | | 5/1994 | |
| JP | 06-348013 | | 12/1994 | |
| JP | 06-348036 | | 12/1994 | |
| JP | 07-045510 | | 2/1995 | |
| JP | 07045510 A | * | 2/1995 | ......... H01L/21/027 |
| JP | 8-208779 | | 8/1996 | |
| JP | 10-073927 | | 3/1998 | |
| JP | 10-279637 | | 10/1998 | |
| JP | 11-133596 | | 5/1999 | |
| JP | 2000-010294 | | 1/2000 | |
| JP | 2000-035672 | | 2/2000 | |
| JP | 2000-063288 | | 2/2000 | |
| JP | 2000-347414 | | 12/2000 | |
| JP | 2000347414 A | * | 12/2000 | ............. G03F/7/11 |
| JP | 2001-19860 | | 1/2001 | |
| JP | 2001-109159 | | 4/2001 | |
| JP | 2001-109165 | | 4/2001 | |
| JP | 2001-281886 | | 10/2001 | |
| JP | 2002-184673 | | 6/2002 | |
| WO | 01/00735 | | 1/2001 | |

OTHER PUBLICATIONS

Chun et al., Proc. SPIE, vol. 4345, pp. 647–654, (2001).
T. Yamauchi et al., Japan J. Appl. Phys., vol. 34, pp. 6615–6621 (1995).
T. Kanda et al., Microlithography World, vol. 8, No. 4, pp. 26 and 27 (1999).
T. Kanda et al., Proceedings of the SPIE, Advances in Resist Technology and Processing XVII, vol. 3999, pp. 881–889 (2000).

* cited by examiner

Primary Examiner—Elena Tsoy
(74) Attorney, Agent, or Firm—Wenderoth, Lind & Ponack, L.L.P.

(57) ABSTRACT

The invention discloses improvements in the so-called coated thermal flow process for reducing the pattern dimension of a patterned resist layer on a substrate to accomplish increased fineness of resist patterning, in which a coating layer of a water-soluble resin formed on the patterned resist layer is heat-treated to effect thermal shrinkage of the coating layer with simultaneous reduction of the pattern dimension followed by removal of the coating layer by washing with water. The improvement of the process is obtained by using an aqueous coating solution admixed with a water-soluble amine compound such as triethanolamine in addition to a water-soluble resin such as a polyacrylic acid-based polymer. Further improvements can be obtained by selecting the water-soluble resin from specific copolymers including copolymers of (meth)acrylic acid and a nitrogen-containing monomer such as N-vinylpyrrolidone, N-vinylimidazolidinone and N-acryloylmorpholine as well as copolymers of N-vinylpyrrolidone and N-vinylimidazolidinone in a specified copolymerization ratio.

4 Claims, No Drawings

METHOD FOR REDUCING PATTERN DIMENSION IN PHOTORESIST LAYER

This is a divisional of Ser. No. 10/173,880, filed on Jun. 19, 2002.

BACKGROUND OF THE INVENTION

The present invention relates to improvements in a method for obtaining a patterned photoresist layer of which the resist pattern has a reduced dimension by a post-patterning heat treatment. More particularly, the invention relates to improvements in the method for reducing the pattern dimension in a photolithographically patterned resist layer by a post-patterning procedure in which a patterned resist layer on a substrate is provided thereon with a coating layer of a water-soluble resin and then the thus coated patterned resist layer is subjected to a heat treatment to effect thermal shrinkage of the resist layer resulting in a reduced pattern dimension followed by complete removal of the coating layer of the water-soluble resin by washing with water.

Along with the recent trend in the technology of semiconductor devices toward higher and higher degrees of integration and more and more compact sizes of the devices, the photolithographic patterning technology of photoresist layers is also required to accomplish finer and finer patterning of the photoresist layer.

An approach for accomplishing the above mentioned requirement in the photolithographic technology for a pattern dimension of 0.20 µm or finer is to use a patterning exposure light of very short wavelengths such as KrF excimer laser beams, ArF excimer laser beams and $F_2$ excimer laser beams as well as electron beams. This approach, however, cannot be successful without development of a photoresist composition having adaptability to these short-wavelength exposure radiations.

In this regard, so-called chemical-amplification photoresist compositions are widely employed in the modern photolithographic technology, in which the catalytic activity of an acid generated in the light-exposed areas from a radiation-sensitive acid-generating agent contained in the resist layer is utilized to effect a solubility change of the resinous ingredient to give high sensitivity and pattern resolution even with a small amount of the acid-generating agent.

As a method for obtaining very finely patterned resist layer on a substrate, there is a known method in which a photoresist layer formed on a substrate is patterned in a conventional way including patterning light-exposure and development and the thus patterned resist layer is provided with a coating layer of a resin by utilizing the activity of the acid diffused from the resist layer followed by a heat treatment so as to effect reduction of the pattern dimension to be finer than the resolution limit inherent in the photoresist composition (Japanese Patent Kokai 5-166717 and 5-241348).

This method, however, has a problem in respect of the relatively large temperature dependency amounting to more than 10 nm/° C. within the substrate surface. This disadvantage can hardly be overcome with the heating device currently employed in the manufacture of semiconductor devices due to poor uniformity of the temperature distribution. Accordingly, the above-described method of post-patterning dimension-reducing method cannot be practiced without substantial variations in the pattern dimensions.

It is also known that the dimension of a patterned resist layer can be reduced below the resolution limit of the photoresist composition by subjecting the patterned resist layer to a heat treatment or a radiation irradiation treatment to cause mobilization of the patterned resist layer. Though advantageous in respect of small temperature dependency of only a few nm/° C. within the plane of the substrate surface, this method has a problem that, due to the difficulty in controlling mobilization of the photoresist layer by the heat treatment, uniform reduction of the dimension of the photoresist layer can hardly be expected within the substrate surface.

Besides the above described photolithographic patterning process by utilizing excimer laser beams for patterning light exposure, proposals are made in Japanese Patent No. 2723260 for reduction of the pattern dimension, according to which a layer of an electron beam resist composition comprising a polymethyl methacrylate resin is patterned to give a patterned resist layer which is then provided thereon with a coating layer of a positive-working resist composition followed by a heat treatment to form a reacted layer at the interface between the patterned resist layer and the positive-working resist layer and removal of the positive-working resist layer from the unreacted areas. Japanese Patent Kokai 6-250379 further discloses a method in which a reacted layer is formed between the underlying patterned resist layer and the upper resist layer by utilizing the acid generated from the acid-generating agent or thermal crosslinking by the acid. Japanese Patent Kokai 10-73927 discloses a method for the manufacture of semiconductor devices by effecting reduction of the pattern dimension in which the overcoating layer is formed by using, as the coating solution, a composition prepared by dissolving a water-soluble resin, water-soluble crosslinking agent or combination thereof in a water-miscible solvent without addition of any photosensitive ingredients. Japanese Patent Kokai 2000-347414 proposes a method in which a substrate surface is provided thereon with a photosensitive layer of a chemical-amplification photoresist composition which is subjected to patterning light-exposure and development to form a patterned resist layer, a coating film is formed on the patterned resist layer by using a coating composition containing a water-soluble resin such as a polyvinyl acetal, water-soluble crosslinking agent such as tetra(hydroxymethyl)glycoluril, a water-soluble nitrogen-containing compound such as amines and, optionally, a fluorine- and silicon-containing surface active agent followed by a heat treatment to form a water-insoluble reacted layer at the interface between the patterned resist layer and the overcoating layer and finally the overcoating layer in the unreacted areas is removed by using a solvent.

Although each of the above-described methods is desirable because reduction of the pattern dimension can be conveniently accomplished to exceed the wavelength limitation of the photoresist composition by forming an upper coating layer on the underlying photoresist layer, several disadvantages are involved therein. For example, the crosslinking reaction of the overcoating composition may overly proceed to unnecessary portions such as the bottom of the patterned resist layer resulting in an undesirable non-orthogonal cross sectional profile thereof eventually with trailing skirts. The dimension of the upper resist layer depends on the mixing baking which is a heat treatment to cause crosslinking. Further, the temperature dependency obtained by these methods is relatively large to be 10 nm/° C. or larger so that it is very difficult to ensure high uniformity of the pattern dimension within the substrate surface when the substrate has a large size or the patterned resist layer is extremely fine resulting in poor controllability in reduction of the pattern dimension.

Besides, a proposal is made in Japanese Patent Kokai 1-307228 and 4-364021 for the so-called thermal flow process in which a patterned photoresist layer formed on a substrate is subjected to a heat treatment or radiation-irradiation treatment to effect mobilization of the resist layer so as to accomplish reduction of the pattern dimension to become finer than the resolution limit of the photoresist composition.

This method, however, is defective because products of reproducible quality can hardly be obtained due to the difficulty encountered in controlling the mobility of the resist by means of heat or radiation. As a further development of this thermal flow process, Japanese Patent Kokai 7-45510 proposes a method in which the mobility of the resist is controlled by providing a coating layer of a water-soluble resin on the patterned photoresist layer formed on a substrate. Since the water-soluble resin used in this method, such as polyvinyl alcohols, is insufficient in the solubility in water required in the removal with water and long-term stability, troubles are sometimes caused by the residual resin film remaining unremoved with water.

SUMMARY OF THE INVENTION

In view of the above described problems and disadvantages in the prior art, the present invention has an object to provide an improvement in the method for reducing the dimension of a patterned photoresist layer by a post-patterning treatment in which the patterned resist layer is provided thereon with a coating layer of a water-soluble resin composition followed by a heat treatment to cause reduction of the pattern dimension or the distance between the resist patterns and then removal of the water-soluble coating layer away from the patterned resist layer by washing with water.

Thus, in a first aspect of the invention, the present invention provides, in a method for reducing a pattern dimension in a patterned photoresist layer formed on a substrate by a post-patterning heat treatment, referred to as the coated thermal flow process hereinafter, comprising the steps of: (a) forming a coating layer of a water-soluble resin composition on the patterned resist layer, (b) drying the coating layer of the aqueous coating solution, (c) subjecting the dried coating layer and the patterned resist layer to a heat treatment to effect thermal shrinkage of the patterned resist layer with reduction of the pattern dimension and (d) removing the coating layer of the water-soluble resin composition, the improvement which comprises: using, in step (a), a coating solution containing a water-soluble resin and a water-soluble amine compound having, preferably, a pKa value of 7.5 to 13.0 at 25° C. for the formation of the coating layer.

In a second aspect of the invention, the improvement provided by the present invention comprises, in step (a) of the coated thermal flow process, using an aqueous coating solution containing a water-soluble resin which is a copolymer of (A) acrylic acid, methacrylic acid or a combination thereof and (B) a water-soluble ethylenically unsaturated compound which is exemplified by N-vinylpyrrolidone, N-vinylimidazolidinone, methyl acrylate, methyl methacrylate, N,N-dimethylacrylamide, N,N-dimethylaminopropyl methacrylamide, N,N-dimethylaminopropyl acrylamide, N-methhylacrylamide, diacetoneacrylamide, N,N-dimethylaminoethyl methacrylate, N,N-diethylaminoethyl methacrylate, N,N-dimethylaminoethyl acrylate, N-acryloylmorpholine and the like, of which those nitrogen-containing water-soluble compounds are preferable, or a combination thereof.

In a third aspect of the invention, the present invention is directed to an improvement of the aqueous coating solution for use in step (a) of the coated thermal flow process in which the water-soluble resin is a copolymer of N-vinylpyrrolidone and a water-soluble monomeric vinyl compound other than N-vinylpyrrolidone which is preferably N-vinylimidazolidinone.

In a fourth aspect of the invention, the present invention provides, in the above-mentioned coated thermal flow process of a patterned resist layer, the improvement which comprises, as a guideline for the selection of the water-soluble resin in step (a) of the method using an aqueous coating solution containing a water-soluble resin exhibiting such a water-solubility behavior that, in a testing procedure comprising the steps of forming a coating layer of the resin on an unpatterned photocured layer of the photoresist composition, subjecting the coating layer to a heat treatment at 140° C. for 60 seconds and removing away the coating film by washing with water at 23° C., the coating layer can be completely removed within 60 seconds.

DETAILED DESCRIPTION OF THE PREFERRED EMBODIMENTS

The present invention provides, according to the first aspect of the invention, an improvement in the formulation of the aqueous coating solution used for the formation of a water-soluble coating layer on a patterned photoresist layer in step (a) of the so-called coated thermal flow process, in which the coating layer and the patterned resist layer are subjected to a heat treatment, for example, at 80 to 160° C. for 30 to 90 seconds followed by complete removal of the coating layer by washing with water. The temperature of this heat treatment should preferably be lower than the softening point of the patterned resist layer. When the heat treatment is conducted at such a temperature, the patterned resist layer receives a tension from the coating layer to give more remarkable reduction in the dimension of holes and trenches with a decrease in the dependency on the duty ratio, i.e. the line distance within the plane of substrate surface. The above-mentioned softening point of the resist layer is a temperature at which, when the patterned resist layer formed on a substrate is gradually heated, an incipient spontaneous flow of the mobilized resist layer is detected.

The water-soluble resin contained in the aqueous coating solution used in the coated thermal flow process is not particularly limitative and can be selected from a variety of water-soluble polymers including alkyleneglycol-based polymers, cellulosic polymers, vinyl polymers, acrylic polymers, urea-based polymers, epoxy polymers, melamine-based polymers and polyamide polymers. Although any of these water-soluble polymers can be used either singly or as a combination of two kinds or more, it is preferable in respect of the efficiency for reduction of the pattern distance without affecting the cross sectional profile of the patterned resist layer that the water-soluble resin is a homopolymer of an acrylic monomer or a copolymer of an acrylic monomer with other copolymerizable monomers.

Examples of the above-mentioned acrylic monomer include acrylic acid, methyl acrylate, methacrylic acid, methyl methacrylate, N,N-dimethyl acrylamide, N,N-dimethylaminopropyl methacrylamide, N,N-dimethylaminopropyl acrylamide, N-methyl acrylamide, diacetone acrylamide, N,N-dimethylaminoethyl methacrylate, N,N-diethylaminoethyl methacrylate, N,N-dimethylaminoethyl acrylate and N-acryloylmorpholine.

Examples of the comonomer compound copolymerized with the above named acrylic monomers include vinyl monomers such as N-vinylpyrrolidone, N-vinylimidazolidinone, vinyl acetate and the like.

The aqueous coating solution used in step (a) of the coated thermal flow process is prepared by dissolving one or a combination of the above named water-soluble resins in water in a concentration of 3 to 50% by weight or, preferably, 5 to 20% by weight. When the concentration is too low, the coating layer formed from the coating solution is sometimes incomplete while, when the concentration is too high, the desired effect of the coated thermal flow process can little be accomplished.

According to the first aspect of the invention, the aqueous coating solution as described above is further admixed with a water-soluble amine compound which, preferably, has a pKa value of 7.5 to 13.0 at 25° C. Examples of suitable amine compounds include alkanolamines such as monoethanolamine, diethanolamine, triethanolamine, 2-(2-aminoethoxy)ethanol, N,N-dimethylethanolamine, N,N-diethylethanolamine, N,N-dibutylethanolamine, N-methylehtanolamine, N-ethylethanolamine, N-butylethanolamine, N-methyldiethanolamine, monoisopropanolamine, diisopropanolamine, triisopropanolamine and the like, polyalkylene polyamines such as diethylenetriamine, triethylenetetramine, propylenediamine, N,N'-diethylethylenediamine, 1,4-butanediamine, N-ethylethylenediamine, 1,2-propanediamine, 1,3-propanediamine, 1,6-hexanediamine and the like, aliphatic amines such as 2-ethylhexylamine, dioctylamine, tributylamine, tripropylamine, triallylamine, heptylamine, cyclohexylamine and the like, aromatic amines such as benzylamine, diphenylamine and the like and cyclic amines such as piperazine, N-methylpiperazine, methylpiperazine, hydroxyethylpiperazine and the like. These amine compounds can be used either singly or as a combination of two kinds or more. It is preferable, however, that the water-soluble amine compound has a boiling point of 140° C. or higher under normal pressure in order not to be lost by the heat treatment of the coating layer. In this regard, monoethanolamine and triethanolamine are suitable.

The amount of the water-soluble amine compound added to the aqueous coating solution is in the range from 0.1 to 30% by weight or, preferably, from 2 to 15% by weight based on the amount of the water-soluble resin. When the amount of the amine compound is too small, the aqueous coating solution eventually suffers a decrease in storage stability due to degradation. When the amount exceeds 30% by weight, in particular, an adverse effect is caused on the cross sectional profile of the patterned resist layer. The problem of denaturation of the aqueous coating solution can be at least partly solved by admixing the coating solution with an acidic compound such as p-toluene sulfonic acid and dodecylbenzene sulfonic acid. The coating layer can be imparted with increased stability by admixing the aqueous coating solution with a surface active agent.

In the method according to the first aspect of the present invention, the patterned resist layer formed on a substrate is coated at least partly with the above described aqueous coating solution followed by drying to give a dried coating layer and then subjected to a heat treatment which can be conducted in substantially the same manner as in the conventional thermal flow process. Namely, the patterned resist layer is coated with the coating solution of the water-soluble resin by using a coating machine such as a spinner and the coating layer is dried by heating at about 80 to 160° C. for 30 to 90 seconds. It is optional that the patterned resist layer coated with the water-soluble resin is subjected beforehand to a pre-baking treatment at 80 to 100° C. for 30 to 90 seconds. The concentration of the water-soluble resin in the aqueous coating solution is in the range from 3 to 50% by weight or, preferably, from 5 to 20% by weight depending on the desired thickness of the coating layer which is in the range from 0.1 to 0.5 μm.

The aqueous solvent used in the above-described aqueous coating solution is usually water but it is optional that the solvent is a mixture of water with a water-miscible alcoholic solvent such as methyl alcohol, ethyl alcohol, propyl alcohol, isopropyl alcohol, glycerin, ethyleneglycol, propyleneglycol, 1,2-butyleneglycol, 1,3-butyleneglycol and 2,3-butyleneglycol. These water-miscible alcoholic solvents can be added to water in a mixing proportion not exceeding 30% by weight based on water.

According to the first aspect of the invention, reduction of the resist pattern dimension accomplished by the coated thermal flow process can be to such an extent that the width of a trench pattern is decreased from 220 nm to 160 nm and the diameter of a hole pattern is decreased from 180 nm to 160 nm. After the thus accomplished thermal shrinkage of the patterned resist layer, the coating layer of the water-soluble resin formed thereon is completely removed by washing for 10 to 60 seconds with an aqueous solvent which is preferably water.

A finely patterned resist layer formed by the photolithographic technology can be imparted in this way with an increased fineness of the pattern dimension to exceed the resolution limit accomplished in a conventional process without affecting other characteristics required for the finely patterned resist layer.

According to the second aspect of the invention, the present invention provides an aqueous coating solution for use in the coated thermal flow process, of which the water-soluble resin is a copolymer consisting of the monomeric units comprising (A) the monomeric units derived from acrylic acid, methacrylic acid or a combination of acrylic and methacrylic acids and (B) the monomeric units derived from various kinds of ethylenically unsaturated monomeric compounds named before including, as preferable ones, N-vinylpyrrolidone, N-vinylimidazolidinone, N-acryloylmorpholine or a combination thereof in a molar ratio of (A):(B) in the range from 4:1 to 1:1. It is preferable that the molar fraction of the monomeric units (A) is larger than that of the units (B). Though not particularly limitative, it is preferable in respect of good film-forming behavior that the above-mentioned binary copolymeric resin has a weight-average molecular weight in the range from 10000 to 50000 as measured by the gel permeation chromatographic method making reference to polymethyl methacrylate resins having known molecular weights.

While the coating solution used in step (a) of the inventive method is basically an aqueous solution of the aforementioned water-soluble copolymeric resin, it is optional that the aqueous solution further contains water-soluble resins of other types in a limited amount including cellulose derivatives, alkyleneglycol-based polymers, urea-based polymers and melamine-based polymers.

The cellulose derivative mentioned above is exemplified by hydroxypropyl methyl cellulose phthalate, hydroxypropyl methyl cellulose acetate phthalate, hydroxypropyl methyl cellulose hexahydrophthalate, hydroxypropyl methyl cellulose acetate succinate, hydroxypropyl methyl cellulose, hydroxypropyl cellulose, hydroxyethyl cellulose, cellulose acetate hexahydrophthalate, carboxylmethyl cellulose, ethyl cellulose and methyl cellulose. The alkyleneglycol-based copolymer is exemplified by addition-polymerized polymers and copolymers of ethyleneglycol, propyleneglycol, butyleneglycol and the like. The urea-based polymer is exemplified by the polymers of methylolated urea, dimethylolated urea, ethyleneurea and the like. The melamine-based polymer is exemplified by the polymers of methoxymethylated melamine, methoxymethylated isobutoxymethylated melamine, methoxyethylated melamine and the like. Besides, epoxy-based polymers and amide-based polymers can also be used, if water-soluble. These water-soluble resins can be used either singly or as a combination of two kinds or more.

The aqueous solvent used in the above-described aqueous coating solution is usually water but it is optional that the solvent is a mixture of water with a water-miscible alcoholic solvent such as methyl alcohol, ethyl alcohol, propyl alcohol, isopropyl alcohol, glycerin, ethyleneglycol, propyleneglycol, 1,2-butyleneglycol, 1,3-butyleneglycol and 2,3-butyleneglycol. These water-miscible alcoholic solvents can be added to water in a mixing proportion not exceeding 30% by weight based on water.

In the fine resist pattern-forming method according to the invention, a desired fine resist pattern can be obtained with good efficiency by successively undertaking the steps including: step (a2) for the formation of a resist pattern on a substrate; step (b2) for the formation of a coating layer of a water-soluble resin on the resist pattern; step (c2) for a heat treatment of the coating layer and step (d2) for the removal of the coating layer by washing with water each as described below.

The step (a2) is a step for the formation of a resist pattern on a substrate by using a resist composition. In this step, which can be conducted according to a conventional photolithographic fine patterning procedure in the manufacture of semiconductor devices, a substrate such as a semiconductor silicon wafer is coated by spin coating with a solution of a chemical-amplification resist, electron beam resist or $F_2$ laser beam resist to form a resist layer which is pattern-wise exposed to light through a photomask bearing a desired pattern or subjected to scanning with electron beams followed by a post-exposure baking treatment and then subjected to a development treatment with an aqueous alkaline solution as a developer such as a 1–10% by weight aqueous solution of tetramethylammonium hydroxide to form the desired resist pattern.

The step (b2) is for the formation of a water-soluble resinous coating layer on the resist pattern wholly or partially by using the above-described aqueous coating solution of a water-soluble resin. The coating method can be the same as that under conventional use in the thermal flow process by using, for example, a spinner, if necessary, followed by heating for drying. The coating layer has a thickness, preferably, in the range from 0.1 to 0.5 μm.

The step (c2) is for a heat treatment of the resist pattern coated with a water-soluble resinous layer in step (b2) so as to decrease the distance between adjacent resist patterns. The heat treatment is conducted usually at a temperature of 80 to 160° C. for 30 to 120 seconds. It is preferable that the heat treatment is conducted at a temperature lower than the softening point of the patterned resist layer because the shrinkage rate of the resist pattern is free from dependency on the duty ratio and fineness of holes and trenches can be further increased by the attractive force exerted by the water-soluble resinous coating layer on the resist pattern. By this heat treatment, a decrease in the dimensions of the resist pattern can be obtained from 220 nm to 160 nm for trenches and from 180 nm to 160 nm for holes.

In step (d2), the water-soluble coating layer covering the resist pattern after the heat treatment in step (c2) is removed by washing with an aqueous solvent or, preferably, deionized water. Removal of the coating layer can be complete by washing usually for 10 to 60 seconds.

In essence, the present invention according to the second aspect of the invention also provides an improved coated thermal flow process in which the aqueous coating solution for the formation of a coating layer on a patterned resist layer contains the above defined copolymeric resin as the resinous ingredient and the heat treatment of the water-soluble coating layer is conducted at a temperature lower than the softening temperature of the patterned resist layer. While the above mentioned heat treatment of the coating layer is conducted usually at 80 to 160° C. for 30 to 120 seconds, it is preferable that the heat treatment temperature is lower than the softening point of the patterned resist layer so that the patterned resist layer is subjected to traction by the thermally shrinking coating layer to cause efficient reduction of the resist pattern dimension with a rate of shrinkage not depending on the duty ratio.

According to the third aspect of the invention, the present invention provides an improved aqueous coating solution used in the coated thermal flow process, in which the water-soluble resinous ingredient contained in the aqueous coating solution is a copolymeric resin consisting of the monomeric units comprising (A1) the monomeric units derived from N-vinylpyrrolidone and (B1) the monomeric units derived from a water-soluble monomeric vinyl compound other than N-vinylpyrrolidone which is preferably N-vinylimidazolidinone in a molar ratio of (A1):(B1) in the range from 1:9 to 9:1. Though not particularly limitative, it is preferable in respect of good film-forming behavior and heat resistance to withstand the heat treatment that the above-mentioned binary copolymeric resin has a weight-average molecular weight in the range from 10000 to 50000 as measured by the gel permeation chromatographic method making reference to polymethyl methacrylate resins having known molecular weights. The coated thermal flow process using the aqueous coating solution containing the above-defined copolymeric resin is conducted in the same way as in the second aspect of the invention.

According to the fourth aspect of the invention, the improvement provided by the present invention is related to a testing procedure for selection of the water-soluble resin as the solute in the aqueous coating solution for the formation of a water-soluble coating layer on a patterned resist layer in the coated thermal flow process.

In practicing the solubility test of the water-soluble resin, a coating layer of the water-soluble resin is formed on an unpatterned but photocured resist layer on a substrate and subjected to a heat treatment at 140° C. for 60 seconds. Thereafter, the thus heat-treated coating layer of the water-soluble resin is washed with water at 23° C. to determine the time taken for complete removal of the coating layer by dissolving away with water, which must be 60 seconds or shorter in order for the resin to be used in the coated thermal flow process according to the present invention.

According to the above-described testing procedure for the solubility behavior of the water-soluble resin, a polymeric resin selected from water-soluble acrylic polymers, vinyl polymers, cellulose derivatives, alkyleneglycol-based polymers, urea-based polymers, melamine-based polymers, epoxy-based polymers and amide-based polymers which passes the test can be used as the resinous ingredient in the aqueous coating solution. The solubility behavior of the water-soluble resin can be adjusted by copolymerizing the above-mentioned acrylic monomer with a minor amount-of comonomers of other types.

In the following, the present invention in various aspects is described in more detail by way of Examples and Comparative Examples, which, however, never limit the scope of the invention in any way.

In the Examples and Comparative Examples described below, the water-soluble resins as a solute in the aqueous coating solution were subjected to a solubility test in the following manner. Thus, a semiconductor silicon wafer was uniformly coated on a spinner with a chemical-amplification positive-working photoresist solution (TDUR-P036PM, a product by Tokyo Ohka Kogyo Co.) followed by a drying heat treatment at 80° C. for 90 seconds to give a dried resist layer having a thickness of 0.7 $\mu$m. The resist layer was then coated uniformly with an aqueous solution of the resin on test and the coating layer was subjected to a heat treatment at 140° C. for 60 seconds to give a coating layer of 0.3 $\mu$m thickness. The substrate bearing the thus heat-treated coating layer was kept in water at 23° C. under vibration to determine the length of time taken before complete dissolution and removal of the coating layer. As a criterion, the water-soluble resins were taken as acceptable when this dissolving took a time not exceeding 60 seconds.

EXAMPLE 1

A semiconductor silicon wafer was uniformly coated on a spinner with a positive-working photoresist composition (TDUR-P036PM, a product by Tokyo Ohka Kogyo Co.) followed by a baking treatment at 80° C. for 90 seconds to form a photoresist layer having a thickness of 560 nm.

The photoresist layer was subjected to a patterning light-exposure treatment with KrF excimer laser beams on a light-exposure machine (Model Canon FPA-3000EX3, manufactured by Canon Co.) followed by a post-exposure baking treatment at 120° C. for 90 seconds and then subjected to a development treatment with a 2.38% by weight aqueous solution of tetramethylammonium hydroxide to give a hole pattern having a diameter of 182.3 nm.

In the next place, the resist layer having the thus formed hole pattern was coated with a coating solution prepared by dissolving 9.1 g of a copolymeric resin of acrylic acid and N-vinylpyrrolidone in a copolymerization ratio of 2:1 by weight and 0.9 g of triethanolamine in 90 g of water to form a coating layer which was subjected to a heat treatment at 120° C. for 60 seconds to cause thermal shrinkage followed by washing with water at 23° C. to dissolve away the coating layer. The result was that the coating layer could be completely removed by washing for about 1 minute with a reduction of the hole pattern diameter to 161.5 nm.

COMPARATIVE EXAMPLE 1

The experimental procedure was substantially the same as in Example 1 except that the coating solution was a 5% by weight aqueous solution of a polyvinyl alcohol. The result obtained by washing away of the coating film with water was that visually recognizable residue of the coating layer was found.

EXAMPLE 2

A semiconductor silicon wafer was uniformly coated on a spinner with a positive-working photoresist composition (TDMR-AR2000, a product by Tokyo Ohka Kogyo Co.) followed by a pre-baking treatment at 90° C. for 90 seconds to form a photoresist layer having a thickness of 1.3 $\mu$m.

In the next place, the photoresist layer was subjected to patterning light exposure on an i-line light-exposure machine (Model Nikon NSR-2205i14E, manufactured by Nikon Co.) followed by a post-exposure baking treatment at 110° C. for 90 seconds and then subjected to a development treatment to give a trench pattern of 411.1 nm width.

The thus formed trench-patterned resist layer was provided in the same manner as in Example 1 with a coating layer of the water-soluble resin followed by a heat treatment to effect thermal shrinkage and then washing away of the coating layer with water. The result was that the width of the trench pattern had been reduced from 411.1 nm to 219.5 nm.

EXAMPLE 3

The experimental procedure was substantially the same as in Example 1 except that the coating solution of a water-soluble resin was prepared by dissolving, in 90 g of water, 9.5 g of a copolymeric resin of acrylic acid and N-vinylpyrrolidone in a copolymerization ratio of 2:1 by weight and 0.5 g of monoethanolamine. The result was that the hole pattern diameter could be reduced from 182.3 nm to 160.3 nm.

EXAMPLE 4

A semiconductor silicon wafer was uniformly coated with a positive-working photoresist composition (EP-TF004EL, a product by Tokyo Ohka Kogyo Co.) on a spinner followed by a pre-baking treatment at 150° C. for 300 seconds to form a resist layer having a thickness of 2.0 $\mu$m.

The thus formed resist layer was pattern-wise irradiated by scanning electron beams on an electron-beam image tracing machine (Model HITACHI HL800D50Kv, manufactured by Hitachi Ltd.) followed by a post-exposure baking treatment at 140° C. for 300 seconds and then subjected to a development treatment with a 2.38% by weight aqueous solution of tetramethylammonium hydroxide to give a trench-patterned resist layer having a trench width of 228.0 nm.

The thus trench-patterned resist layer was coated with the same aqueous coating solution as used in Example 1 and the coating layer was subjected to a heat treatment at 150° C. for 90 seconds to effect thermal shrinkage followed by washing away of the coating layer with water to find that removal of the coating layer was complete after washing for about 60 seconds. The width of the trench pattern was reduced from 228.0 nm to 155.0 nm.

EXAMPLE 5

A semiconductor silicon wafer was uniformly coated on a spinner with a positive-working photoresist solution (TDUR-P036PM, supra) followed by a pre-baking treatment at 80° C. for 90 seconds to give a photoresist layer of 560 nm thickness, which was pattern-wise light-exposed on a light-exposure machine (Model Canon FPA-3000EX3, supra) and, after a post-exposure baking treatment at 120° C. for 90 seconds, subjected to a development treatment with a 2.38% by weight aqueous solution of tetramethylammonium hydroxide to give a patterned resist layer having a hole pattern of 178.1 nm diameter.

Separately, an aqueous coating solution was prepared by dissolving, in 45 g of water, 20 g of a resin mixture consisting of a polyacrylic acid resin and a poly(N-vinylpyrrolidone) resin in a weight proportion of 55:45. The resin mixture had been subjected to the test of solubility behavior as described before to find that the dissolving time of the resin mixture was one second.

The above prepared patterned resist layer was coated with the aqueous coating solution followed by a heat treatment at 120° C. for 60 seconds to effect thermal shrinkage. Thereafter, the coating layer was washed with water at 23° C. to find that removal of the coating layer was complete by washing for 60 seconds. The hole pattern diameter could be reduced to 157.4 nm and the cross sectional profile of the patterned resist layer was excellently orthogonal.

COMPARATIVE EXAMPLE 2

A coating solution for comparative test was prepared by dissolving 5 g of a polyvinyl alcohol resin in 95 g of water. Separately, the polyvinyl alcohol resin was subjected to the solubility test to find that removal of the coating layer was still incomplete even after 120 seconds of the washing time.

A test of coated thermal flow process was undertaken in the same manner as in Example 5 excepting the use of the above prepared polyvinyl alcohol solution as the coating solution to find that no acceptable patterned resist layer could be obtained due to remaining residue of the coating layer on the substrate.

COMPARATIVE EXAMPLE 3

The testing procedure was substantially the same as in Example 5 except that no coating layer was formed on the patterned resist layer. The result of the test was that substantially no reduction of the pattern dimension could be obtained.

EXAMPLE 6

A semiconductor silicon wafer was spin-coated with a positive-working photoresist composition (TDUR-P036PM, supra) and subjected to a pre-baking treatment at 80° C. for 90 seconds to form a photoresist layer of 560 nm thickness.

The photoresist layer was pattern-wise exposed to light on a light-exposure machine (Model Canon FPA-3000EX3, supra) followed by a post-exposure baking treatment at 120° c. for 90 seconds and then subjected to a development treatment with a 2.38% by weight aqueous solution of tetramethylammonium hydroxide to give a patterned resist layer having a hole pattern of 178.1 nm diameter.

Separately, a polyacrylic acid resin was subjected to the water-solubility test by using an aqueous solution of 5.0 g of the resin in 45 g of water to find that the dissolving time was 1 second.

The hole-patterned resist layer was coated with the aqueous solution of the polyacrylic acid resin followed by drying to form a dried coating layer thereon and then subjected to a heat treatment at 120° C. for 60 seconds to effect thermal shrinkage of the patterned resist layer followed by washing with water at 23° C. to find that removal of the coating layer was complete by washing for 1 second and the diameter of the hole pattern was reduced to 161.4 nm.

EXAMPLE 7

A semiconductor wafer was spin-coated with the same positive-working photoresist composition as used in Example 6 followed by a pre-baking treatment at 80° C. for 90 seconds to form a photoresist layer of 560 nm thickness which was subjected to a pattern-wise light-exposure in the same manner as in Example 6 followed by a post-exposure baking treatment at 120° C. for 90 seconds and then a development treatment in the same manner as in Example 6 to give a hole-patterned resist layer having a hole diameter of 178.1 nm.

Separately, a water-soluble poly(N-acryloylmorpholine) resin was subjected to the water-solubility test by using a 10% by weight aqueous solution of the resin to find that the dissolving time of the resinous layer was 1 second.

The above prepared hole-patterned resist layer was coated with an aqueous solution of the water-soluble resin tested above and dried to form a coating layer of the resin which was subjected to a heat treatment at 120° C. for 60 seconds to effect thermal shrinkage of the patterned resist layer followed by removal of the coating layer by washing with water to find that removal of the coating layer was complete by washing for 1 second and the diameter of the hole pattern was reduced to 166.9 nm.

EXAMPLE 8

A semiconductor silicon wafer was spin-coated with the same positive-working photoresist composition as used in Example 6 followed by a pre-baking treatment at 80° C. for 90 seconds to form a photoresist layer of 560 nm thickness which was pattern-wise exposed to light followed by a post-exposure baking treatment and a development treatment in the same manner as in Example 6 to form a patterned resist layer having a hole pattern of 180.3 nm diameter.

The thus formed patterned resist layer was coated with a 10% by weight aqueous coating solution of a water-soluble resin which was a copolymer of acrylic acid and N-vinylpyrrolidone in a copolymerization ratio of 55:45 by weight followed by a heat treatment at 120° C. for 60 seconds to effect thermal shrinkage of the patterned resist layer and then removal of the coating layer by washing with water to find that removal of the coating layer was complete by washing for 60 seconds and the diameter of the hole pattern, of which the cross sectional profile was excellently orthogonal, was reduced to 157.4 nm.

EXAMPLE 9

A semiconductor silicon wafer was spin-coated with a photoresist composition (TDMR-AF2000, a product by Tokyo Ohka Kogyo Co.) followed by a pre-baking treatment at 90° C. for 90 seconds to form a photoresist layer of 1.3 μm thickness, which was pattern-wise exposed to light on the same exposure machine as used in Example 2 followed by a post-exposure baking treatment at 110° C. for 90 seconds and development in the same manner as in Example 2 to give a trench-patterned resist layer of 411.1 nm dimension.

The thus obtained trench-patterned resist layer was subjected to the coated thermal flow process in just the same manner as in Example 8 so that the dimension of the trench pattern of the resist layer, which had an excellently orthogonal cross sectional profile, was reduced to 219.5 nm.

COMPARATIVE EXAMPLE 4

The experimental procedure was substantially the same as in Example 9 excepting for the omission of coating on the patterned resist layer with a coating solution of a water-soluble resin. The result was that no reduction could be obtained in the width of the trench-patterned resist layer.

COMPARATIVE EXAMPLE 5

The experimental procedure was just the same as in Example 9 except that the aqueous coating solution of the water-soluble resin was replaced with a 5% by weight aqueous solution of a polyvinyl alcohol. The result was that, after removal of the coating layer by washing with water, trace of the coating layer could be clearly detected by visual inspection.

EXAMPLE 10

The experimental procedure was just the same as in Example 8 except that the coating layer of a water-soluble resin on the patterned resist layer was formed by using a 10% by weight aqueous solution of a copolymeric resin of acrylic acid and N-acryloylmorpholine in a copolymerization ratio of 1:1 by weight. The result was that removal of the coating layer by washing with water was complete by washing for 1 second and the hole diameter of the hole-patterned resist layer, which had an excellent cross sectional profile, was reduced to 159.7 nm.

EXAMPLE 11

The procedure for the formation of a hole-patterned resist layer on a semiconductor silicon wafer was just the same as in Example 1 except that the hole pattern obtained had a diameter of 180.3 nm. The procedure of the coated thermal flow process was also just the same as in Example 1 except that the aqueous coating solution of a water-soluble resin was a 10% by weight aqueous solution of a copolymeric resin of N-vinylpyrrolidone and N-vinylimidazolidinone in a copolymerization ratio of 1:3 by weight. The result was that removal of the coating layer was complete by washing with water for 60 seconds and the diameter of the hole pattern of the resist layer, which had an excellently orthogonal dross sectional profile, was reduced to 170.1 nm.

EXAMPLE 12

The experimental procedure was just the same as in Example 2 except that the aqueous coating solution of a water-soluble resin in Example 2 was replaced with the coating solution used in Example 10. The result was that the trench width of the trench-patterned resist layer, which had an excellently orthogonal cross sectional profile, was reduced to 345.3 nm.

What is claimed is:

1. A method for reducing dimensions of a resist pattern on a substrate surface which comprises the steps of:
   (a2) coating the patterned resist layer with an aqueous coating solution containing a water-soluble resin which is a copolymer of N-vinylpyrrolidone and a comonomer which is N-vinylimidazolidinone, N-acryloylmorpholine or a combination thereof to form a coating layer of the aqueous coating solution;
   (b2) drying the coating layer to form a dried coating layer of the water-soluble resin;
   (c2) subjecting the dried coating layer to a heat treatment to effect thermal shrinkage of the coating layer and reduction of the resist pattern dimension; and
   (d2) dissolving away the coating layer completely by washing with water.

2. The method as claimed in claim 1 in which the water-soluble resin is a copolymer of N-vinylpyrrolidone and N-vinylimidazolidinone.

3. The method as claimed in claim 2 in which the water-soluble resin is a copolymer of N-vinylpyrrolidone and N-vinylimidazolidinone in a copolymerization ratio in the range from 9:1 to 1:9 by moles.

4. The method as claimed in claim 1 in which the temperature of the heat treatment in step (c2) is lower than the softening temperature of the patterned resist layer.

* * * * *